(12) United States Patent
Taylor et al.

(10) Patent No.: US 11,249,268 B2
(45) Date of Patent: Feb. 15, 2022

(54) HEAT DISSIPATION ENCLOSURE

(71) Applicant: COMMSCOPE TECHNOLOGIES LLC, Hickory, NC (US)

(72) Inventors: Christopher Charles Taylor, Cheltenham (GB); David Patrick Murray, Bristol (GB); David Thomas, Chester (GB)

(73) Assignee: CommScope Technologies LLC, Hickory, NC (US)

( * ) Notice: Subject to any disclaimer, the term of this patent is extended or adjusted under 35 U.S.C. 154(b) by 45 days.

(21) Appl. No.: 16/643,687

(22) PCT Filed: Sep. 7, 2018

(86) PCT No.: PCT/US2018/049904
§ 371 (c)(1),
(2) Date: Mar. 2, 2020

(87) PCT Pub. No.: WO2019/051196
PCT Pub. Date: Mar. 14, 2019

(65) Prior Publication Data
US 2021/0157079 A1 May 27, 2021

Related U.S. Application Data

(60) Provisional application No. 62/555,828, filed on Sep. 8, 2017.

(51) Int. Cl.
*G02B 6/44* (2006.01)
*H02G 3/03* (2006.01)
(Continued)

(52) U.S. Cl.
CPC ......... *G02B 6/4454* (2013.01); *G02B 6/4441* (2013.01); *H02G 3/03* (2013.01); *H02G 3/16* (2013.01); *H05K 7/2039* (2013.01)

(58) Field of Classification Search
CPC ...... G02B 6/4454; G02B 6/4441; H02G 3/03; H02G 3/16; H05K 7/2039
See application file for complete search history.

(56) References Cited

U.S. PATENT DOCUMENTS 4,254,447 A * 3/1981 Griffis ................ H01L 23/3672
174/16.3
4,448,147 A * 5/1984 Dewaegheneire ....... G12B 1/00
116/216
(Continued)

FOREIGN PATENT DOCUMENTS

KR 10-2016-0064365 A 6/2016

OTHER PUBLICATIONS

Extended European Search Report for Extended European Patent Application No. 18853633.8 dated Apr. 8, 2021, 8 pages.
(Continued)

*Primary Examiner* — Peter Radkowski
(74) *Attorney, Agent, or Firm* — Merchant & Gould P.C.

(57) ABSTRACT

Disclosed herein is an enclosure including a housing for dissipating heat from first and second heat generating components located on first and second circuit boards, respectively. In the enclosure, a first heat sink plate and a second heat sink plate are spring biased apart from one another. A maximum spring biasing distance between the first heat sink plate and the second heat sink plate is greater than a distance between the interior side of the front wall and the interior side of the back wall of the housing.

17 Claims, 7 Drawing Sheets

(51) Int. Cl.
 *H02G 3/16* (2006.01)
 *H05K 7/20* (2006.01)

(56) References Cited

U.S. PATENT DOCUMENTS

| | | | | |
|---|---|---|---|---|
| 4,651,928 A * | 3/1987 | Schmidt | F23N 1/027 | 239/61 |
| 4,666,656 A * | 5/1987 | Bertrand | G01K 1/18 | 376/247 |
| 4,753,457 A * | 6/1988 | Oda | F28F 21/04 | 285/187 |
| 4,838,581 A * | 6/1989 | Oda | F28F 9/06 | 285/187 |
| 4,875,712 A * | 10/1989 | Oda | F28F 9/06 | 285/47 |
| 4,923,179 A | 5/1990 | Mikolajczak | | |
| 4,944,454 A * | 7/1990 | Widemann | F23N 5/025 | 237/12.3 C |
| 5,308,172 A * | 5/1994 | Upadhya | H01J 35/1024 | 384/453 |
| 6,381,844 B1 | 5/2002 | Bollesen | | |
| 6,386,890 B1 * | 5/2002 | Bhatt | H05K 3/325 | 439/66 |
| 6,431,459 B1 * | 8/2002 | Humburg | B60H 1/2209 | 237/2 A |
| 6,611,431 B1 * | 8/2003 | Lee | H01L 23/4006 | 257/719 |
| 6,901,221 B1 * | 5/2005 | Jiang | G02B 6/4214 | 385/14 |
| 7,068,510 B2 * | 6/2006 | Crippen | H05K 7/2049 | 165/80.3 |
| 7,142,427 B2 * | 11/2006 | Reents | H01L 23/4093 | 361/704 |
| 7,268,425 B2 * | 9/2007 | Mallik | H01L 23/13 | 257/706 |
| 7,443,026 B2 * | 10/2008 | Goldmann | H05K 1/0271 | 257/718 |
| 7,456,047 B2 * | 11/2008 | Mallik | H01L 23/13 | 257/E21.499 |
| 7,474,530 B2 * | 1/2009 | Stewart | H01L 23/4006 | 165/104.33 |
| 7,495,922 B2 * | 2/2009 | Ploeg | H01L 23/40 | 257/718 |
| 7,778,036 B2 * | 8/2010 | Kontani | H05K 7/2049 | 361/719 |
| 7,855,891 B1 | 12/2010 | Ayres, III et al. | | |
| 7,932,596 B2 * | 4/2011 | Mallik | H01L 23/49816 | 257/712 |
| 9,052,477 B2 * | 6/2015 | Oki | G02B 6/4256 | |
| 9,459,312 B2 * | 10/2016 | Arena | G01R 31/2808 | |
| 9,913,361 B2 * | 3/2018 | Barron | H05K 1/181 | |
| 10,005,215 B2 * | 6/2018 | Tan | B29C 45/2806 | |
| 10,632,657 B2 * | 4/2020 | Tan | B29C 45/7331 | |
| 10,779,391 B2 * | 9/2020 | Barron | H05K 5/0008 | |
| 2004/0069997 A1 * | 4/2004 | Dair | G02B 6/4214 | 257/81 |
| 2004/0173901 A1 * | 9/2004 | Mallik | H01L 25/0655 | 257/738 |
| 2005/0122691 A1 * | 6/2005 | Crippen | H05K 7/20727 | 361/719 |
| 2006/0146499 A1 * | 7/2006 | Reents | H01L 23/427 | 361/704 |
| 2006/0269216 A1 | 11/2006 | Wiemeyer et al. | | |
| 2007/0279873 A1 * | 12/2007 | Mallik | H01L 23/4006 | 361/719 |
| 2008/0123311 A1 * | 5/2008 | Goldmann | H05K 3/325 | 361/783 |
| 2008/0165501 A1 * | 7/2008 | Stewart | H01L 23/4006 | 361/704 |
| 2008/0239678 A1 * | 10/2008 | Ploeg | H01L 23/40 | 361/719 |
| 2009/0079061 A1 * | 3/2009 | Mallik | H01L 23/13 | 257/712 |
| 2009/0290310 A1 * | 11/2009 | Kontani | H05K 7/2049 | 361/720 |
| 2011/0123150 A1 | 5/2011 | Zbinden et al. | | |
| 2012/0103970 A1 * | 5/2012 | Lubomirsky | H01L 21/67103 | 219/460.1 |
| 2012/0193072 A1 * | 8/2012 | Enomura | F28D 7/10 | 165/81 |
| 2012/0237171 A1 * | 9/2012 | Oki | G02B 6/4277 | 385/78 |
| 2014/0064675 A1 * | 3/2014 | Tanaka | G02B 6/4214 | 385/89 |
| 2014/0101709 A1 | 4/2014 | Rathod et al. | | |
| 2014/0306728 A1 * | 10/2014 | Arena | G01R 31/2808 | 324/750.08 |
| 2014/0329405 A1 | 11/2014 | Hsieh | | |
| 2015/0131980 A1 * | 5/2015 | Maemura | H05B 1/0202 | 392/488 |
| 2015/0268436 A1 * | 9/2015 | Blackwell, Jr. | G02B 6/3897 | 385/135 |
| 2016/0361856 A1 * | 12/2016 | Tan | B29C 45/72 | |
| 2017/0196075 A1 * | 7/2017 | Barron | H01L 23/40 | |
| 2018/0160524 A1 * | 6/2018 | Barron | H05K 1/181 | |
| 2018/0257283 A1 * | 9/2018 | Tan | B29C 45/72 | |
| 2018/0259266 A1 * | 9/2018 | Enomura | F28D 7/024 | |

OTHER PUBLICATIONS

International Search Report and Written Opinion of the International Searching Authority for International Patent Application No. PCT/US2018/049904 dated Jan. 10, 2019, 6 pages.

* cited by examiner

HEAT DISSIPATION ENCLOSURE

CROSS-REFERENCE TO RELATED APPLICATION

This application is a National Stage Application of PCT/US2018/049904, filed on Sep. 7, 2018, which claims the benefit of U.S. Patent Application Ser. No. 62/555,828, filed on Sep. 8, 2017, the disclosures of which are incorporated herein by reference in their entireties. To the extent appropriate, a claim of priority is made to each of the above disclosed applications.

TECHNICAL FIELD

The present disclosure relates generally to enclosures for dissipating heat produced in the enclosures. The present disclosure also relates generally to enclosures useful in conjunction with hybrid electrical/optical fiber cables.

BACKGROUND

Telecommunications systems typically employ a network of telecommunications cables capable of transmitting large volumes of data and voice signals over relatively long distances. More recently, these cables have also been used to enable remote powering of electronic devices. The telecommunications cables can include fiber optic cables, electrical cables, combinations of electrical and fiber optic cables, or hybrid electrical/optical fiber cables. A typical telecommunications network also includes a plurality of telecommunications enclosures integrated throughout the network of telecommunications cables. The telecommunications enclosures are adapted to house and protect telecommunications components.

Telecommunications enclosures that hold circuitry for transmitting or converting optical signals and electrical signals sometimes generate significant amounts of heat that can negatively affect the operation of the circuits within the enclosure. For example, the heat generated can cause reduced efficiency, reduced lifespan, or other negative effects. Improvements are desired.

SUMMARY

The present disclosure relates to an enclosure. The enclosure comprises a housing having a front wall having an interior side and an exterior side and a back wall having an interior side and an exterior side. The enclosure further comprises a first assembly and a second assembly. The first assembly comprises a first circuit board and a first heat sink plate. The second assembly comprises a second circuit board and a second heat sink plate. The first circuit board has a first side and a second side. Similarly, the second circuit board has a first side and a second side. The first side of the first circuit board faces the first side of the second circuit board and the second side of the first circuit board opposes the first side of the first circuit board. The second side of the second circuit board opposes the first side of the second circuit board. First heat generating electrical components are on the second side of the first circuit board and contact the first heat sink plate. Second heat generating electrical components are on the second side of the second circuit board and contact the second heat sink plate. The enclosure also comprises a fastening arrangement securing the two assemblies together. The first heat sink plate and the second heat sink plate are spring biased apart from one another. A maximum spring biasing distance between the first heat sink plate and the second heat sink plate is greater than a distance between the interior side of the front wall and the interior side of the back wall of the housing.

DETAILED DESCRIPTION

In the following detailed description, reference is made to the accompanying drawings showing by way of illustration specific embodiments of enclosures disclosed herein. It is to be understood that other embodiments may be utilized and structural or logical changes may be made without departing from the scope of the present disclosure. The following detailed description, therefore, is not to be taken in a limiting sense.

Aspects of the present disclosure relate to an enclosure having a housing in which a first heat sink plate and a second heat sink plate are constantly in contact with walls of the housing. Aspects of the present disclosure further relate to an enclosure having a housing in which a first heat sink plate and a second heat sink plate are spring biased apart from one another so that a maximum spring biasing distance between the first heat sink plate and the second heat sink plate is greater than a distance between walls of the housing.

Aspects of the present disclosure also relate to an enclosure having a housing in which a first heat sink plate and a second heat sink plate continuously dissipate heat from first heat generating components and second heat generating components through walls of the housing.

Additionally, aspects of the present disclosure relate to enclosures that can efficiently route hybrid electrical/optical fiber cables in a daisy chain manner. Aspects of the present disclosure relate to enclosures that can efficiently route optical fibers through an optical to electrical converter to a device powered by power over Ethernet. Aspects of the present disclosure relate to enclosures that can efficiently route optical fibers and power separately into a device having both an electrical power port and an optical power port.

Power over Ethernet (PoE) systems pass electric power along with data on twisted pair Ethernet cabling. This allows a single cable to provide both data connection and electric power to devices such as wireless access points, IP cameras, and VoIP phones. Examples of devices powered by power over Ethernet are VoIP phones; IP cameras; wireless access points; IPTV decoders; network routers; network intercom/paging/public address systems and hallway speaker amplifiers; wall clocks; outdoor roof mounted radios; industrial devices (e.g., sensors, controllers, meters, etc.); access control points (e.g., intercoms, entry cards, keyless entry, etc.); lighting controllers and LED lighting fixtures; stage and theatrical devices (e.g., networked audio breakout and routing boxes); and remote point of sale kiosks.

Figure 1:
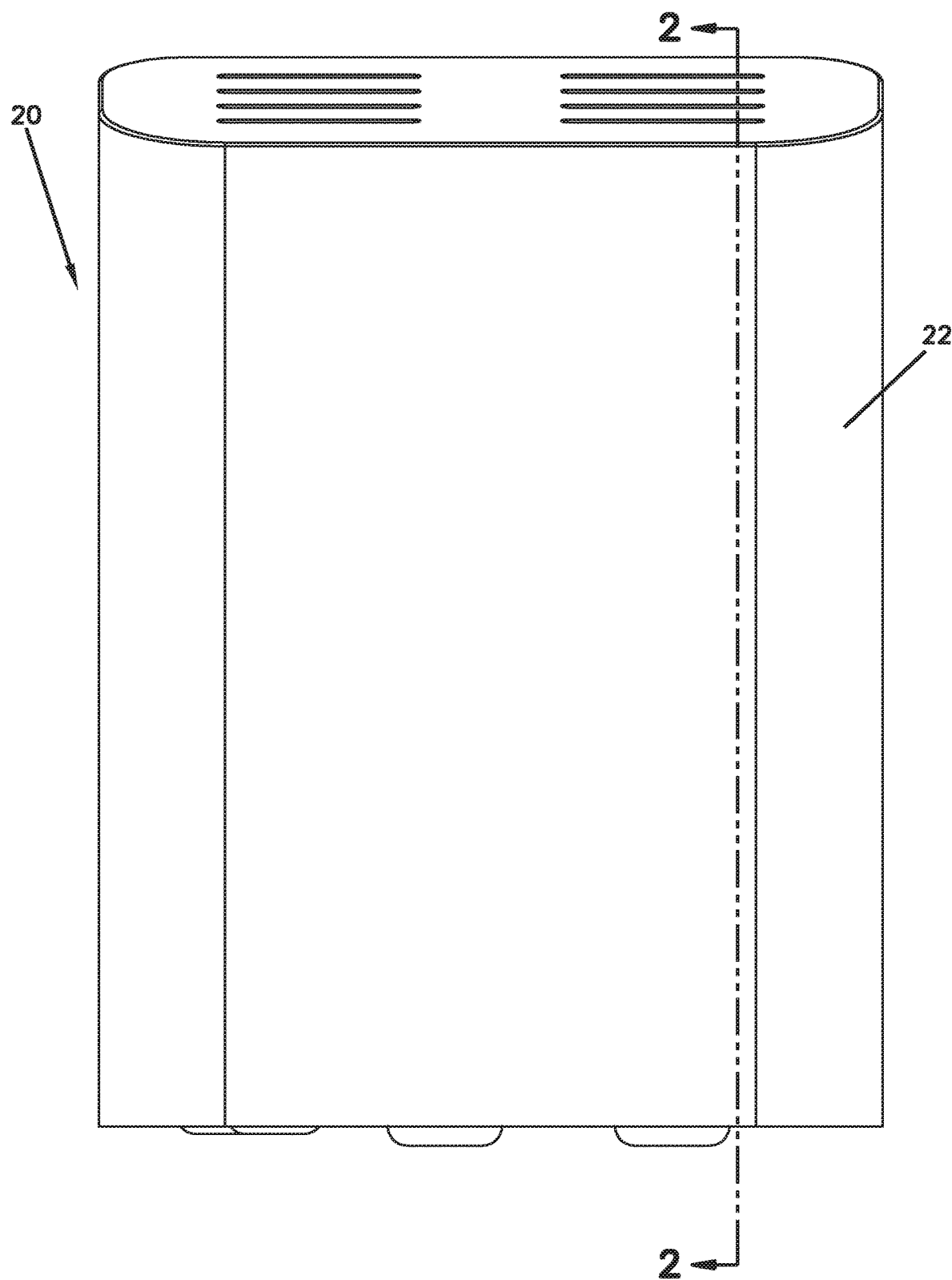
FIG. 1 is a front view of an embodiment of an enclosure as disclosed herein.
Figure 2:
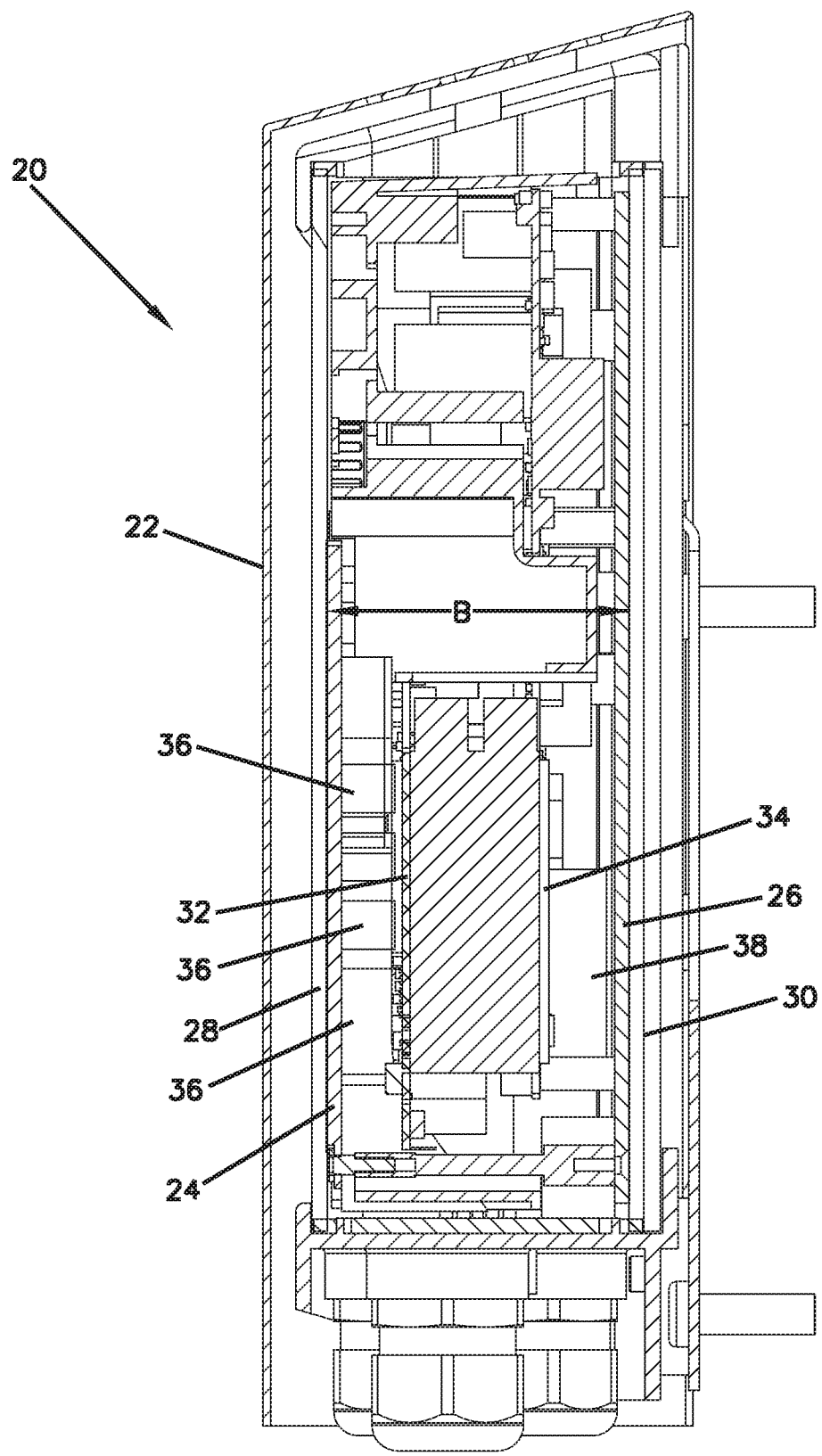
FIG. 2 shows a cross-sectional view of the embodiment of the enclosure of FIG. 1 along the line 2-2.

FIGS. 1-4 illustrate an exemplary embodiment of an enclosure 20. FIG. 1 shows an cover 22 of the enclosure 20. The cover 22 encloses a housing 23. FIG. 2, which depicts a cross-sectional view along the line 2-2 of FIG. 1, shows first and second heat sink plates 24, 26 in contact with front and back walls 28, 30 of the housing 23.

In particular, the housing 23 has a front wall 28 having an interior side and an exterior side and a back wall 30 having an interior side and an exterior side. There is a gap between the front wall 28 and the back wall 30. In this gap, the enclosure 20 includes a first assembly and a second assembly. The first assembly includes a first circuit board 32 and the first heat sink plate 24. The second assembly includes a second circuit board 34 and a second heat sink plate 26.

As depicted in FIG. 2, the first circuit board 32 is closer to the front wall 28 of the housing 23 and the second circuit board 34 is closer to the back wall 30 of the housing 23. The first circuit board 32 has a first side and a second side. Similarly, the second circuit board 34 has a first side and a second side. The first side of the first circuit board 32 faces the first side of the second circuit board 34 and the second side of the first circuit board 32 opposes the first side of the first circuit board 32. The second side of the second circuit board 34 opposes the first side of the second circuit board 34. Thus, the first sides of the respective circuit boards 32, 34 face each other and the second sides of the respective circuit boards 32, 34 face outwardly towards the front and back walls 28, 30 of the housing 23.

In the particular embodiment depicted in FIGS. 1-4, the first circuit board 32 and the second circuit board 34 are parallel. Similarly, the first heat sink plate 24 and the second heat sink plate 26 are parallel. Furthermore, the first circuit board 32 and the first heat sink plate 24 are parallel. Moreover, the second circuit board 34 and the second heat sink plate 26 are parallel.

In the particular embodiment depicted in FIGS. 1-4, the first heat sink plate 24 and the second heat sink plate 26 are each rectangular in shape. Similarly, the first circuit board 32 and the second circuit board 34 are each rectangular in shape. However, it should be appreciated that the first heat sink plate 24, the second heat sink plate 26, the first circuit board 32, and the second circuit board 34 can be any of a variety of shapes.

First heat generating electrical components 36 are on the second side of the first circuit board 32 and contact the first heat sink plate 24. Second heat generating electrical components 38 are on the second side of the second circuit board 34 and contact the second heat sink plate 26.

As used herein, the term "heat generating electrical component" refers to any type of active or passive electronic component that produces heat during normal operation. For example, heat generating components include any devices or circuitry involved in the conversion of optical signals to electric signals or vice versa, including but not limited to high speed data processing integrated circuits, power switching transistors, inductors, and DC-DC converters. Accordingly, the enclosure 20 can house active or passive electronic circuitry related to fiber optic signal transmission or conversion.

The enclosure 20 also comprises a fastening arrangement securing the two assemblies together. The fastening arrangement can include one or more spring biasing structures.

The first heat sink plate 24 and the second heat sink plate 26 are spring biased apart from one another. A maximum spring biasing distance between the first heat sink plate 24 and the second heat sink plate 26 is greater than a distance B between the interior side of the front wall 38 and the interior side of the back wall 30 of the housing 23. Due to the maximum spring biasing distance between the first heat sink plate 24 and the second heat sink plate 26 being greater than the distance B, the first heat sink plate 24 and the second heat sink plate 26 are in constant contact with the interior side of the front wall 28 and the interior side of the back wall 30. This allows heat from the first and second heat generating electrical components 36, 38 to transfer to the first and second heat sink plates 24, 26 and then to transfer to the front and back walls 28, 30 of the housing 23.

Figure 7:
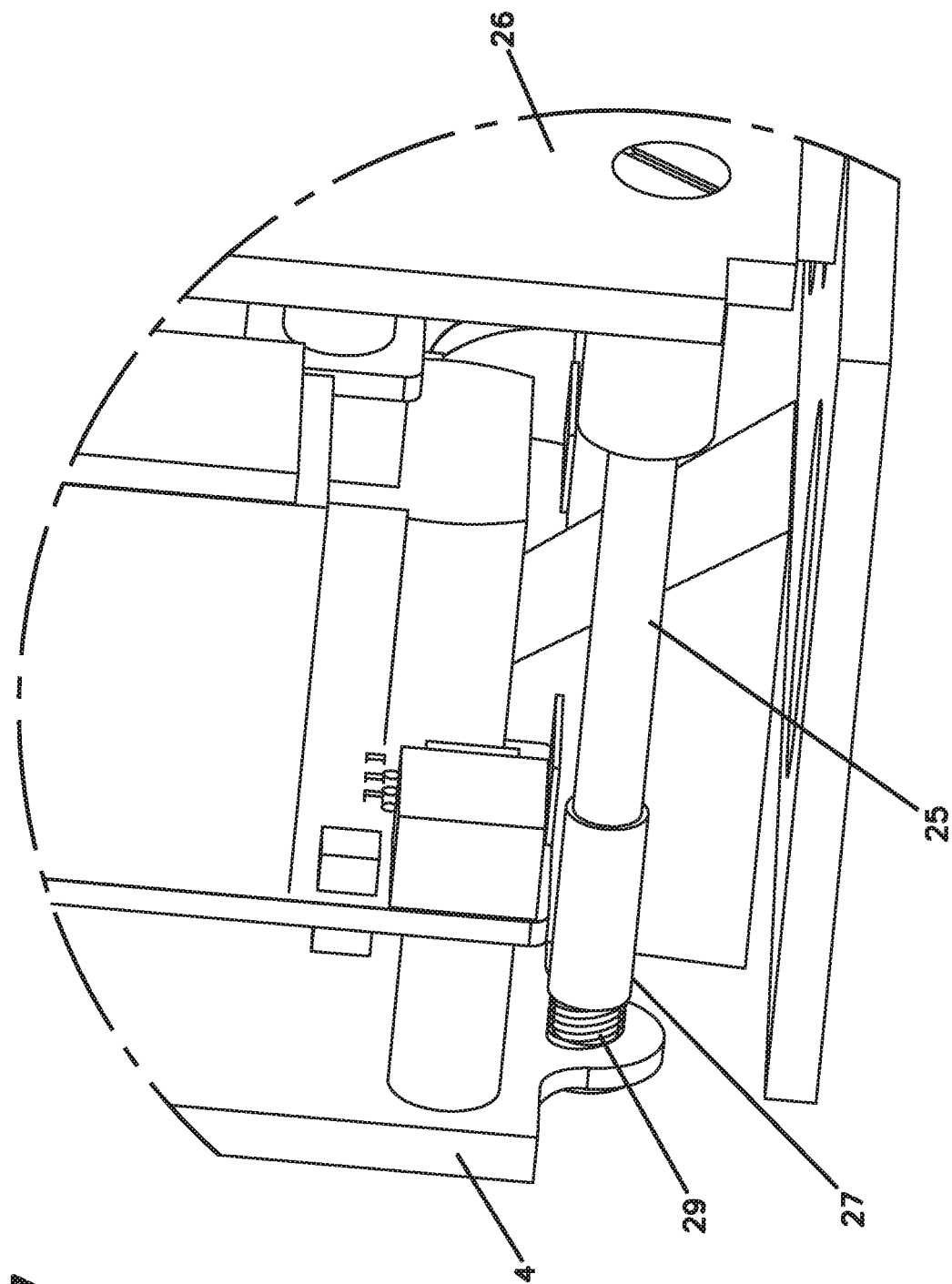
FIG. 7 shows a spring biasing structure of the embodiment of the enclosure of FIG. 1.

One or more spring biasing structures spring bias the first heat sink plate 24 and the second heat sink plate 26 apart and away from one another. In the exemplary embodiment of FIGS. 1-4, each spring biasing structure includes a fastener 25 having a shoulder 27 and a spring 29 (see FIG. 7). The fastener extends between the first heat sink plate 24 and the second heat sink plate 26. The spring 29 extends between the first heat sink plate 24 and the shoulder 27. In some embodiments, the fastener includes a shoulder bolt. The enclosure can include any number of spring biasing structures. However, in certain embodiments, the enclosure has four spring biasing structures. For example, when the first heat sink plate 24 and the second heat sink plate 26 are each rectangular in shape, four spring biasing structures can extend between corners of the first heat sink plate 24 and the second heat sink plate 26.

Figure 3:
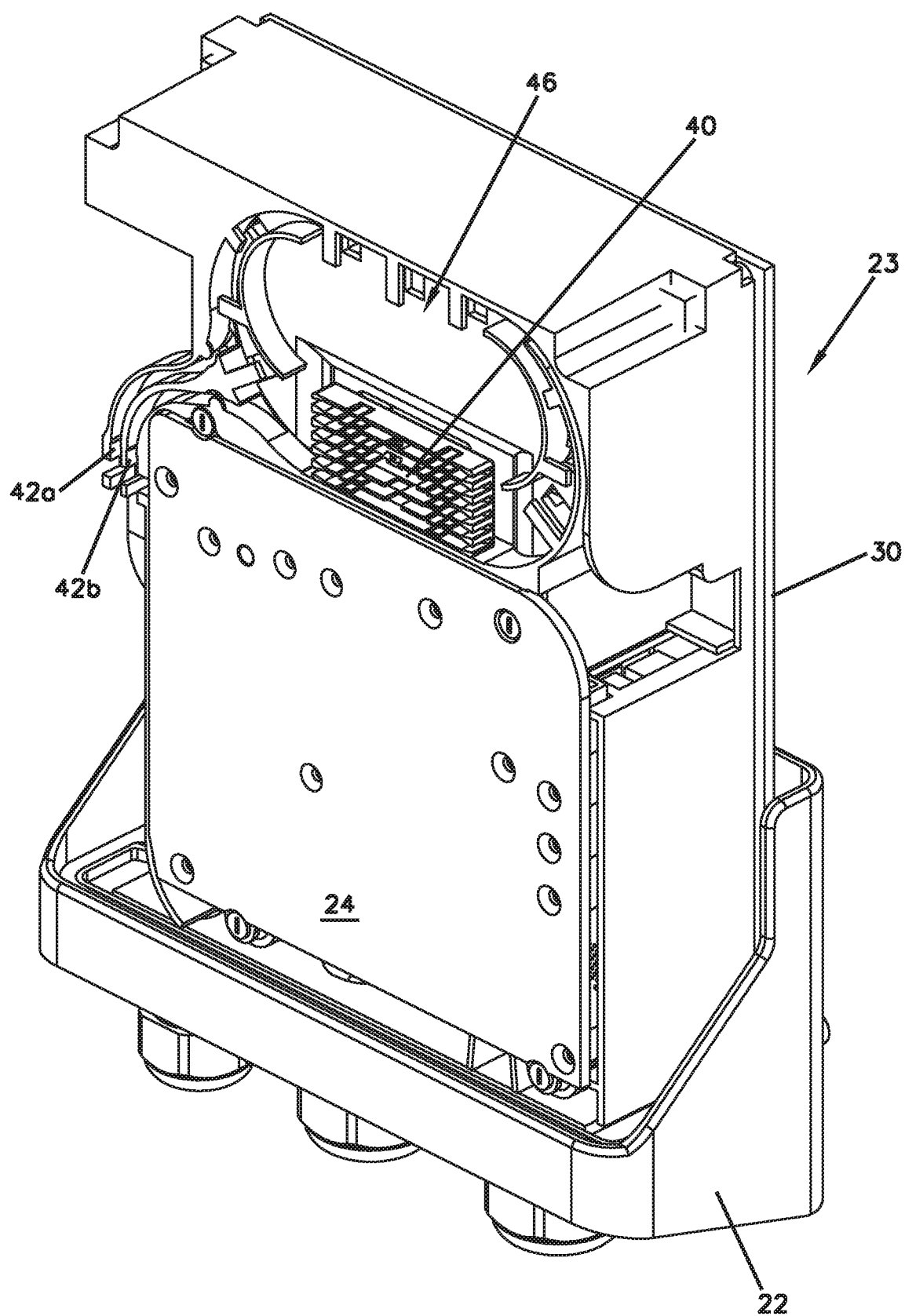
FIG. 3 is a cutaway perspective view of the embodiment of the enclosure of FIG. 1 showing the interior of the enclosure.

FIG. 3, which is a cutaway perspective view of the cover 22 and the housing 23 with the front wall 28 of the housing 22 removed, shows the second heat sink plate 26 abutting the rear wall 30 of the housing 22 due to the spring biasing. Likewise, although not shown in FIG. 3, the first heat sink plate 24 abuts the front wall 28 of the housing due to the spring biasing.

Figure 4:
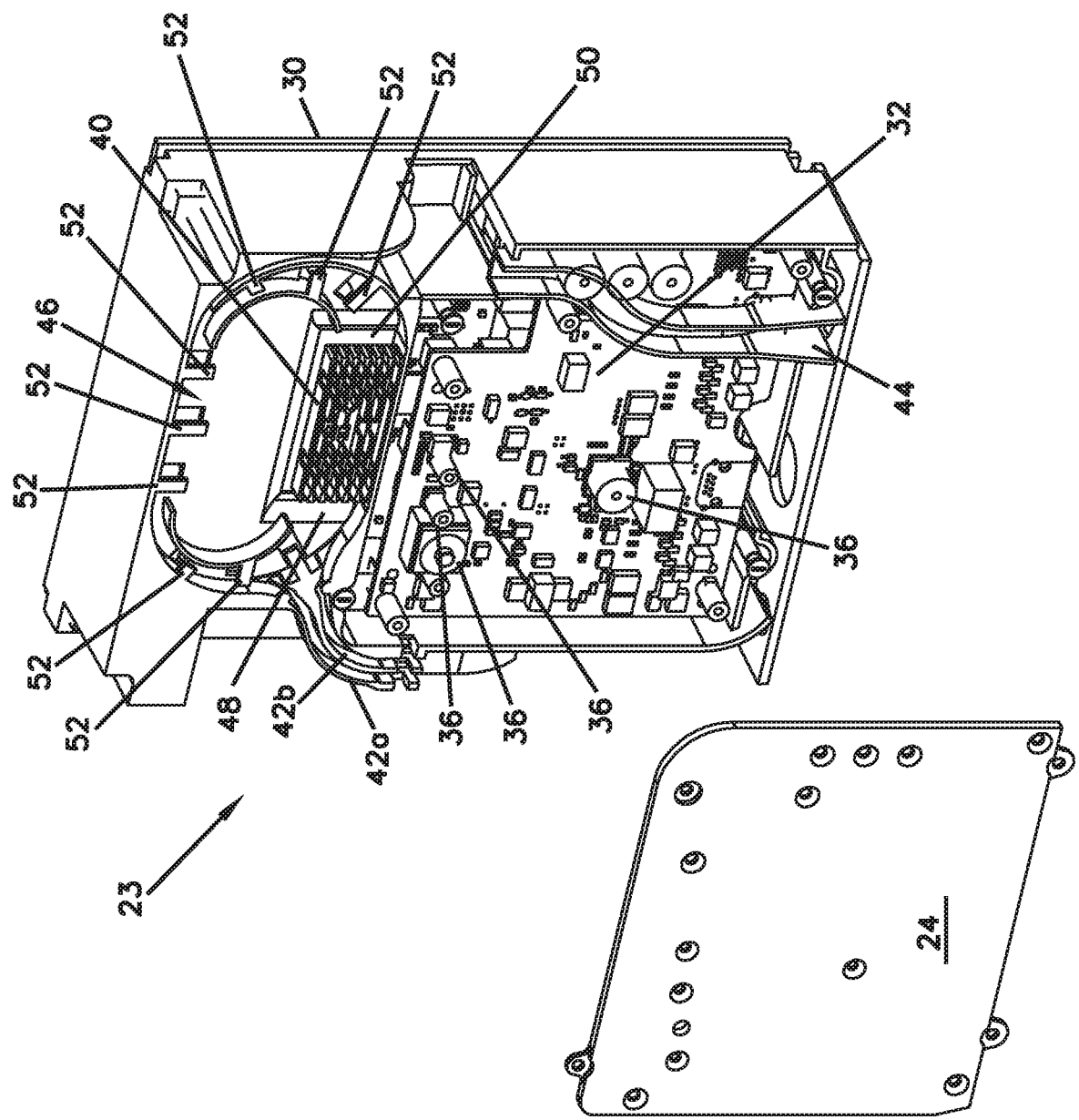
FIG. 4 shows a partially exploded view of the housing of the embodiment of the enclosure of FIG. 1.

FIG. 4 shows first heat generating electrical components 36 on the first circuit board 32. The view in FIG. 4 shows the first heat sink plate 24 on the front side of the housing 22 exploded away from contact with the first heat generating electrical components 36.

If desired, a heat pad may be disposed between each heat generating electrical component and each heat sink plate such that each heat pad is in contact with the heat generating electrical component and the heat sink plate. As used herein, the term "heat pad" refers to any thermally conductive pad that provides a thermal path between a heat generating electrical component and a heat sink plate. A heat pad can be deformable to help maintain contact between a heat generating electrical component and a heat sink plate. Heat pads are known in the art.

Alternatively, if desired, a thermal transfer compound (also known as a heat transfer compound) may be disposed on each heat generating electrical component and such that the thermal transfer compound is located between each heat generating electrical component and each heat sink plate. Such compounds are known in the art.

Heat transfers from the first and second heat generating electrical components 36, 38 to the first and second heat sink plates 24, 26 to the front and back walls 28, 30 of the housing 23 and subsequently through the cover 22 to the external environment. Accordingly, each of the first and second heat sink plates 24, 26, each of the front and back walls 28, 30, and the cover 22 has a construction that includes a thermally conductive material (e.g., metal).

In one embodiment, the housing 23 has a construction that includes metal. Similarly, in an embodiment, the first and second heat sink plates 24, 26 have a construction that includes metal. Likewise, in an embodiment, the front and back walls 28, 30 of the housing 23 have a construction that includes metal. The cover can have a construction that includes metal.

The metal can have a composition that includes aluminum. For example, the metal can be an aluminum alloy. In an embodiment, each of the first and second heat sink plates 24, 26 and the front and back walls 28, 30 of the housing 23 are made of metal having a composition that includes aluminum.

The cover 22 can be die cast. Alternatively, the cover 22 can be a metal extrusion having a composition that includes aluminum.

As shown in the embodiment depicted in FIGS. 1-4, the enclosure can further include a splice tray 40 located in the interior of the housing 23 at a location above the first circuit board 32 and the second circuit board 34 (see FIGS. 3 and 4). The enclosure 20 can also include a plurality of adjacent channels (e.g., two adjacent channels 42a, 42b as depicted in FIGS. 3 and 4) located in the interior of the housing 23 that receive optical fibers from the splice tray 40 and guide the optical fibers out of the enclosure. The enclosure 20 can include a chute 44 additionally located in the interior of the housing 22 that receives and guides optical fibers from a fiber guiding structure 46 located adjacent to the splice tray 40 and guides the optical fibers out of the enclosure 20. As shown in the depicted embodiment, a fiber guiding structure 46 is located above the splice tray 40 and has a semi-oval shape. However, it should be appreciated that the fiber guiding structure 46 can have a variety of configurations and, therefore, have any of a variety of shapes.

Figure 5:
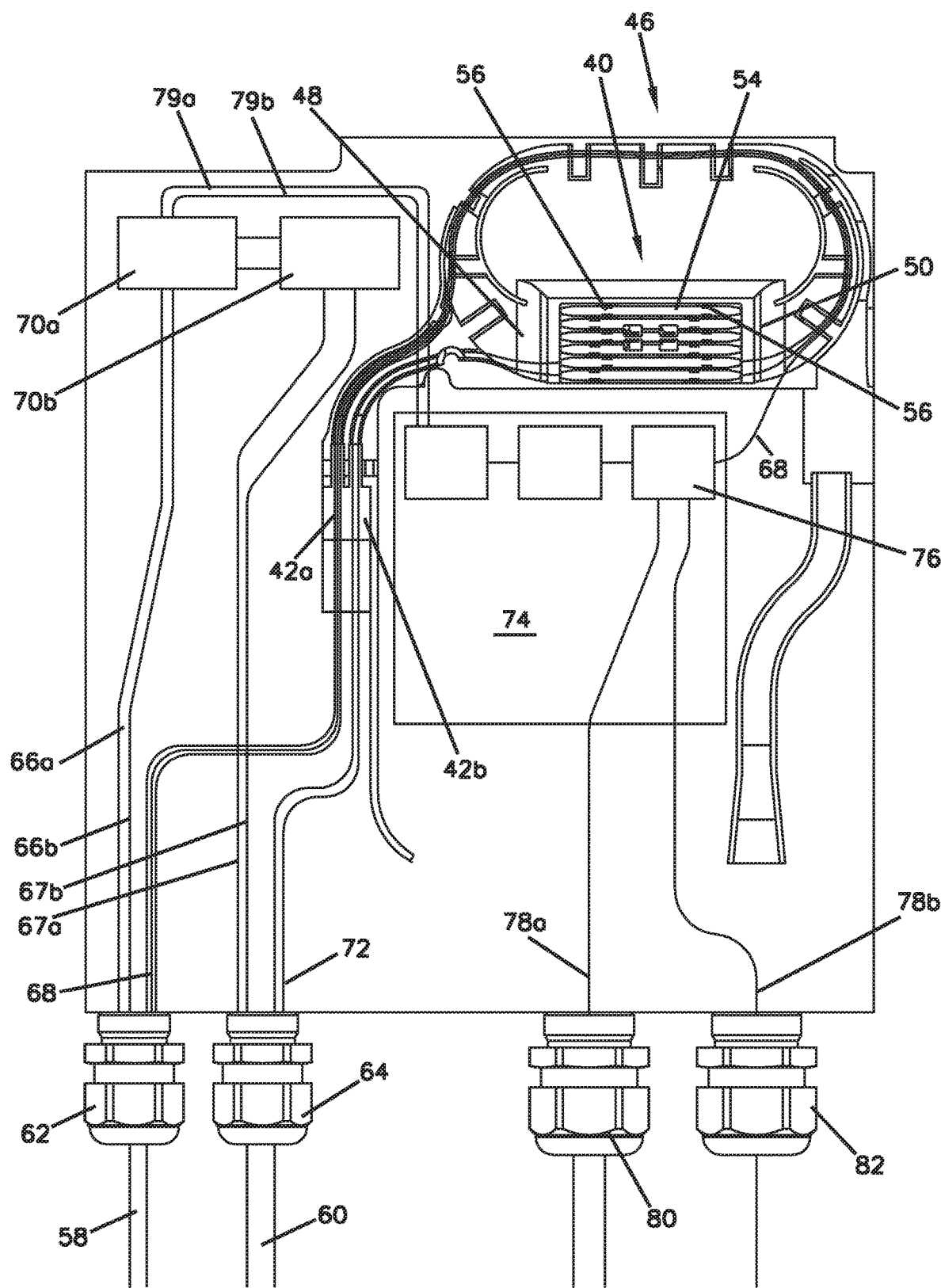
FIG. 5 shows an exemplary use of the enclosure of FIG. 1 in a daisy chain manner to route optical fibers to an optical to electric converter in active equipment.
Figure 6:
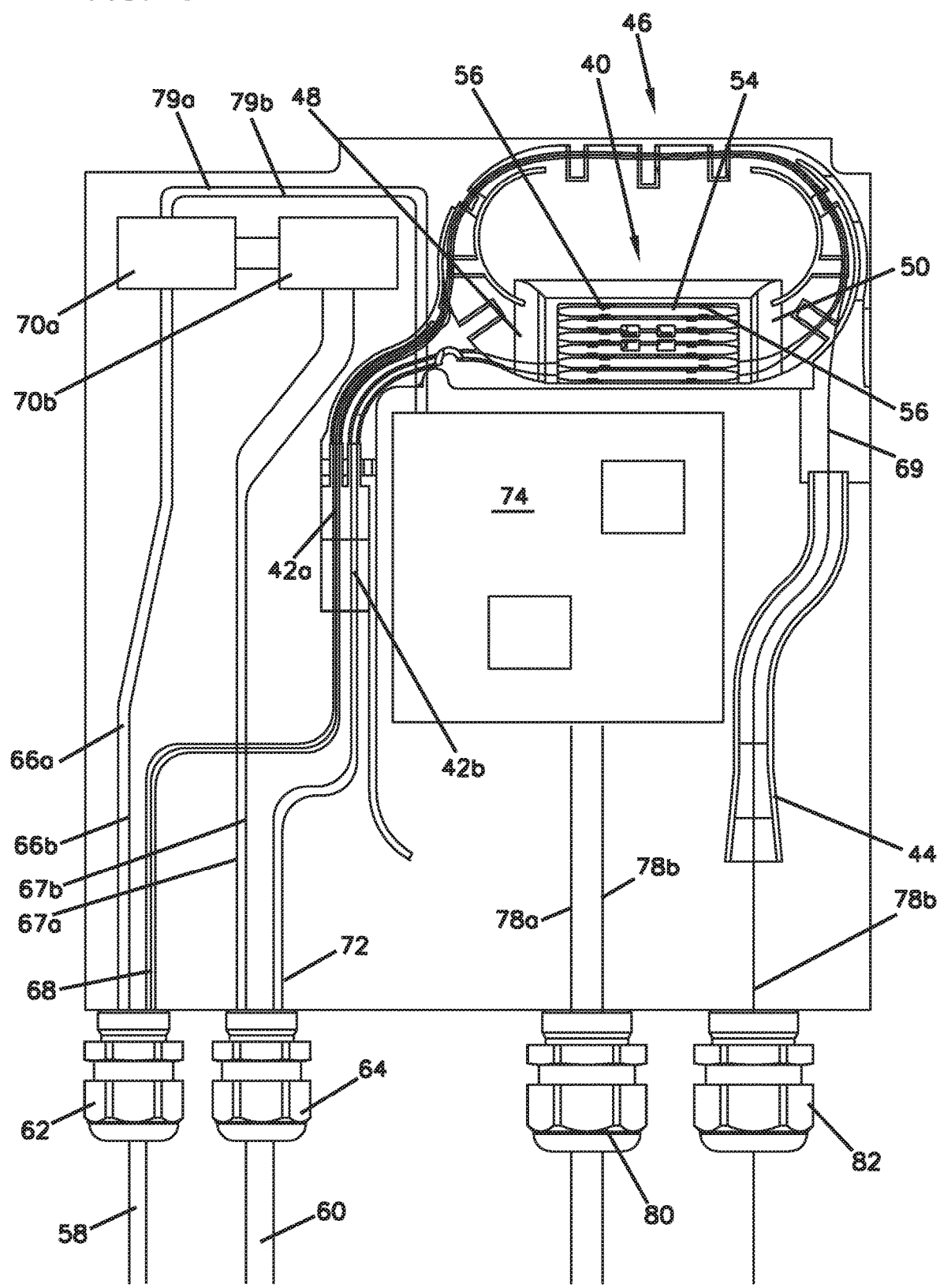
FIG. 6 shows another exemplary use of the enclosure of FIG. 1 in a daisy chain manner.

As shown in FIGS. 5 and 6, the depicted splice tray 40 has a plurality of furcation tubes 54 situated on splice holders 56 between a first end 48 of the fiber guiding structure 46 and a second end 50 of the fiber guiding structure 46. As depicted, the fiber guiding structure 46 includes spaced apart tabs 52 extending from walls of the fiber guiding structure 46 that secures the optical fibers in the fiber guiding structure 46.

FIGS. 5 and 6 provide examples of the versatility of the enclosure 20 to power various devices. FIG. 5 shows an exemplary use of the enclosure of FIG. 1 in a daisy chain manner to route optical fibers to an optical to electric converter in active equipment and power devices by power over Ethernet. FIG. 6 shows another exemplary use of the enclosure of FIG. 1 in a daisy chain manner to connect to devices having both a power port and a fiber optic port. As used herein, the term "active equipment" refers to one or more electronic components or circuits. Examples of active equipment include a voltage converter, a filtration device, a resolution device, an overvoltage protection device, an over current protection device, a microprocessor subsystem, device(s) for optical to electrical conversion, device(s) for data packet switching, power over Ethernet power sourcing equipment, etc.

As shown in FIG. 5, a hybrid cable 58 enters an inlet port 62. The electrical conductors 66a, 66b (e.g., one power and one ground or electrical conductors for differential power, for example, +100V and −100V) are routed to a power connector 70a, which is connected to a power connector 70b. Electrical conductors 79a, 79b connect the power connector 70a to a piece of active equipment 74. Another hybrid cable 60 is routed to an outlet port 64. Electrical conductors 67a, 67b are routed to the power connector 70b. Meanwhile, the optical fibers 68 of hybrid cable 58 are routed through channel 42a and into the first end 48 of the fiber guiding structure 46, around the fiber guiding structure 46, and out of the second end 50 of the fiber guiding structure 46. Some of the fibers 68 are routed into the splice tray 40 where they are spliced with optical fibers 72 of the hybrid cable 60. The channel 42b carries optical fibers 72 from the outlet port 64. One or more other fibers 68 are also routed into the piece of active equipment 74 including an optical to electrical converter 76. Electrical conductors 78a, 78b exit the optical to electrical converter 76 and exit the enclosure through additional outlet ports 80 and 82. These electrical conductors 78a, 78b can then be directed to RJ45 Ethernet jacks (not shown). Each of electrical conductors 78a, 78b are one or more twisted pairs and carry both data and power. In this manner, the enclosure can be used in both a daisy chain and to power devices through power over Ethernet.

As shown in FIG. 6, a hybrid cable 58 enters an inlet port 62. The electrical conductors 66a, 66b (e.g., one power and one ground or electrical conductors for differential power, for example, +100V and −100V) are routed to a power connector 70a, which is connected to a power connector 70b. Electrical conductors 79a, 79b connect the power connector 70a to a piece of active equipment 74. Another hybrid cable 60 is routed to an outlet port 64. Electrical conductors 67a, 67b are routed to the power connector 70b. Meanwhile, the optical fibers 68 are routed through channel 42a and into the first end 48 of the fiber guiding structure 46, around the fiber guiding structure 46, and out of the second end 50 of the fiber guiding structure 46. Some of the fibers 68 are routed into the splice tray 40 where they are spliced with optical fibers 72 of the hybrid cable 60. The channel 42b carries optical fibers 72 from the outlet port 64. One or more device fibers 69 is spliced to one or more other fibers 68. The one or more device fibers 69 enters the chute 44 and then exits an outlet port 82 and can be directed to an optical fiber port in a downstream device (not shown). Electrical conductors 78a, 78b from the piece of active equipment 74 exit outlet port 80 and can be directed to an electrical port in the downstream device (not shown). In this manner, the enclosure can be used in both a daisy chain and to power a device having both an electrical port and an optical fiber port.

From the foregoing detailed description, it will be evident that modifications and variations can be made to the enclosures disclosed herein without departing from the spirit or scope of the disclosure.

REFERENCE LETTERS/NUMBERS line 2-2
distance B
enclosure 20
cover 22
housing 23
first heat sink plate 24
fastener 25
second heat sink plate 26
shoulder 27
front wall 28
spring 29
back wall 30
first circuit board 32
second circuit board 34
first heat generating electrical components 36
second heat generating electrical components 38 splice tray 40
channel 42a
channel 42b
chute 44
fiber guiding structure 46
first end 48
second end 50
tab 52
furcation tube 54
splice holder 56
hybrid cable 58
hybrid cable 60
inlet port 62
outlet port 64
electrical conductor 66a
electrical conductor 66b
electrical conductor 67a
electrical conductor 67b
optical fibers 68
device fibers 69
power connector 70a
power connector 70b
optical fibers 72
piece of active equipment 74
optical to electrical converter 76
electrical conductor 78a
electrical conductor 78b
electrical conductor 79a
electrical conductor 79b
outlet port 80
outlet port 82

What is claimed is:

1. An enclosure, comprising:
a housing having a front wall having an interior side and an exterior side and a back wall having an interior side and an exterior side;
a first assembly and a second assembly, the first assembly comprising a first circuit board and a first heat sink plate, the second assembly comprising a second circuit board and a second heat sink plate, the first circuit board having a first side and a second side, the second circuit board having a first side and a second side, the first side of the first circuit board facing the first side of the second circuit board and the second side of the first circuit board opposing the first side of the first circuit board, and the second side of the second circuit board opposing the first side of the second circuit board;
first heat generating electrical components on the second side of the first circuit board, the first heat generating components contacting the first heat sink plate;
second heat generating electrical components on the second side of the second circuit board, the second heat generating components contacting the second heat sink plate; and
a shoulder bolt providing a fastening arrangement for securing the two assemblies together such that the first heat sink plate and the second heat sink plate are spring biased apart from one another, and a maximum spring biasing distance between the first heat sink plate and the second heat sink plate is greater than a distance between the interior side of the front wall and the interior side of the back wall of the housing.

2. The enclosure of claim 1, wherein the first circuit board and the second circuit board are parallel.

3. The enclosure of claim 1, wherein the first heat sink plate and the second heat sink plate are parallel.

4. The enclosure of claim 1, wherein the first circuit board and the first heat sink plate are parallel.

5. The enclosure of claim 1, wherein the second circuit board and the second heat sink plate are parallel.

6. The enclosure of claim 1, further comprising a splice tray located in an interior of the housing above the first circuit board and the second circuit board.

7. The enclosure of claim 6, further comprising a plurality of adjacent channels located in the interior of the housing that receive optical fibers from the splice tray and guide the optical fibers out of the enclosure.

8. The enclosure of claim 7, wherein the plurality of adjacent channels is two adjacent channels.

9. The enclosure of claim 7, further comprising a chute located in the interior of the housing that receives and guides optical fibers from a fiber guiding structure located adjacent to the splice tray and guides the optical fibers out of the enclosure.

10. The enclosure of claim 9, wherein the fiber guiding structure is located above the splice tray and has a semi-oval shape.

11. The enclosure of claim 9, wherein the splice tray has a plurality of furcation tubes situated on splice holders between a first end of the fiber guiding structure and a second end of the fiber guiding structure.

12. The enclosure of claim 9, wherein spaced apart tabs extending from walls of the fiber guiding structure secure the optical fibers in the fiber guiding structure.

13. The enclosure of claim 1, wherein the first heat sink plate and the second heat sink plate are spring biased apart from one another by one or more spring biasing structures, each spring biasing structure comprising a fastener having a shoulder and a spring, wherein the fastener extends between the first heat sink plate and the second heat sink plate and the spring extends between the first heat sink plate and the shoulder.

14. The enclosure of claim 13, wherein the enclosure has four spring biasing structures.

15. The enclosure of claim 1, wherein the first heat sink plate and the second heat sink plate are each rectangular in shape.

16. The enclosure of claim 1, wherein the first circuit board and the second circuit board are each rectangular in shape.

17. The enclosure of claim 14, wherein the first heat sink plate and the second heat sink plate are each rectangular in shape and the four spring biasing structures extend between corners of the first heat sink plate and corners of the second heat sink plate.

* * * * *